US007550756B2

(12) United States Patent
Asano et al.

(10) Patent No.: US 7,550,756 B2
(45) Date of Patent: Jun. 23, 2009

(54) SEMICONDUCTOR MEMORY (75) Inventors: Isamu Asano, Tokyo (JP); Tsuyoshi Kawagoe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/481,849

(22) Filed: Jul. 7, 2006

(65) Prior Publication Data
US 2007/0090336 A1    Apr. 26, 2007

(30) Foreign Application Priority Data
Jul. 8, 2005  (JP)  .............................. 2005-200054

(51) Int. Cl.
*H01L 47/00*    (2006.01)
(52) U.S. Cl. ........................ 257/3; 257/2; 257/4; 257/5; 257/E45.002; 257/E45.003
(58) Field of Classification Search ................. 257/2–4, 257/E45.002–E45.003
See application file for complete search history.

(56) References Cited

U.S. PATENT DOCUMENTS

| 5,534,711 | A | * | 7/1996 | Ovshinsky et al. | ............. 257/3 |
| 2004/0087074 | A1 | | 5/2004 | Hwang et al. | |
| 2005/0111247 | A1 | * | 5/2005 | Takaura et al. | .................. 365/2 |
| 2005/0263823 | A1 | * | 12/2005 | Hwang et al. | ............... 257/368 |

FOREIGN PATENT DOCUMENTS

| JP | 4-45585 A | 2/1992 |
| JP | 2000-349247 A | 12/2000 |
| JP | 2004-31953 A | 1/2004 |
| JP | 2004-153047 A | 5/2004 |
| JP | 2004-289029 A | 10/2004 |

* cited by examiner

*Primary Examiner*—Sue Purvis
*Assistant Examiner*—Minchul Yang
(74) *Attorney, Agent, or Firm*—Sughrue Mion, PLLC (57) ABSTRACT

In a semiconductor memory comprising a matrix of memory cells each composed of one transistor and one chalcogenide layer as a memory element, no chalcogenide layer is disposed at a joint between an upper electrode wire connected to the chalcogenide layer and another wiring layer.

11 Claims, 9 Drawing Sheets

SEMICONDUCTOR MEMORY

This application claims priority to prior Japanese patent application JP 2005-200054, the disclosure of which is incorporated herein by reference.

BACKGROUND OF THE INVENTION

1. Field of the Invention

The present invention relates to a semiconductor memory and more particularly to a semiconductor memory using a phase-change material.

2. Description of the Related Art

Figure 1A:
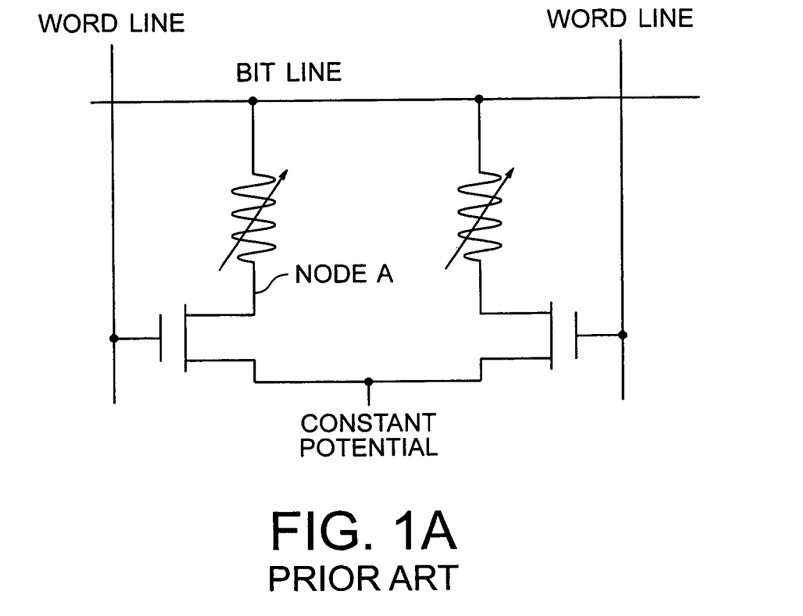
FIG. 1A is a circuit diagram of a memory cell including a memory element of a chalcogenide layer in the related art.
Figure 1B:
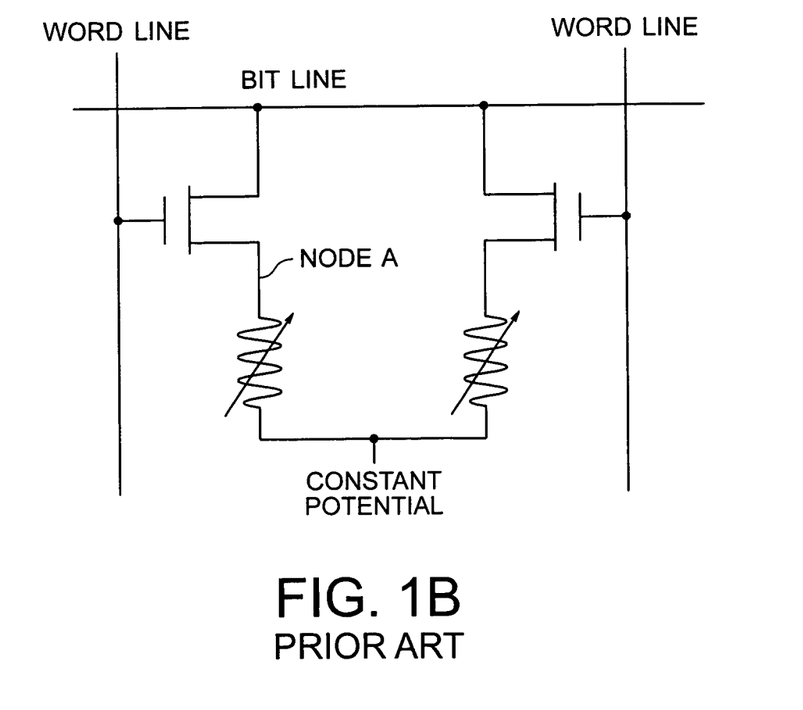
FIG. 1B is a circuit diagram of another memory cell in the related art.

Conventionally, a phase-change memory using a phase-change material has been known. A memory element of a phase-change memory is formed of a chalcogenide material. The resistance of the chalcogenide material represents memory information. FIG. 1 illustrates the circuit diagram of a memory cell. A memory cell includes a variable resistor of a chalcogenide layer and an access transistor. In a memory cell illustrated in FIG. 1A, one end of a resistor is connected to a bit line. The other end of the resistor is connected to a drain of a transistor. A source of the transistor is connected to a constant potential. A gate of the transistor is connected to a word line. In a memory cell illustrated in FIG. 1B, a resistor and a transistor between a bit line and a constant potential are disposed in reverse. This memory cell can operate in the same way as the memory cell illustrated in FIG. 1A.

Reading in these memory cells is performed by reading out an electric current passing through a bit line when an access transistor connected to a selected word line is brought into conduction. "1" or "0" is determined by the electric current that passes through the bit line and varies with the resistance of a chalcogenide layer. Writing of memory information is performed when an access transistor connected to a selected word line is brought into conduction and the resulting Joule heat of the electric current passing through a chalcogenide layer changes the crystalline state of the chalcogenide layer.

Writing of memory information onto the chalcogenide layer is performed by the following two operations. In one operation referred to as "reset", the chalcogenide layer is once melted by the supply of sufficient Joule heat and is then quenched to maintain an amorphous state of a high-resistivity layer. In the other operation referred to as "set", a slightly smaller amount of Joule heat is supplied to cool the chalcogenide layer slowly and thereby a crystalline state having a face-centered cubic structure of low resistance is formed. The amount of supplied heat and the cooling rate are controlled by the current value and the length (time) of a pulse applied to the chalcogenide layer. Thus, different crystal structures of the chalcogenide layer and variations in resistance allow reading and writing of the memory.

The following prior documents disclose these phase-change memories. In Japanese Unexamined Patent Application Publication No. 04-045585, a chalcogenide layer formed on a lower heater electrode is patterned by an upper electrode to form a chalcogenide layer having a small diameter. Japanese Unexamined Patent Application Publication No. 2004-031953 discloses stacked phase-change memories. Japanese Unexamined Patent Application Publication No. 2004-153047 discloses a memory element including a chalcogenide layer between a lower heater electrode and an upper electrode both formed on the same plane. These documents disclose a structure in which an electric current from an electrode is converged into a memory element to improve the current efficiency during writing. Japanese Unexamined Patent Application Publication No. 2004-289029 discloses a phase-change memory that includes a memory element having a chalcogenide layer of a different composition and is thereby operable at elevated temperatures.

SUMMARY OF THE INVENTION

The present inventors have faced another problem in a study of a phase-change memory. This problem will be described below with reference to cross-sectional views of a phase-change memory cell illustrated in FIGS. 2A and 2B. An opening is formed in a second interlayer insulating film 17 to form a contact plug 19, which serves as a lower heater electrode. A chalcogenide layer 20 and an upper electrode 21 are formed on the contact plug 19 and are patterned. Examples of the upper electrode 21 include a film that may be formed by sputtering and contains one selected from the group consisting of a high-melting-point metal and nitride thereof, such as tungsten (W), titanium nitride (TiN), tantalum nitride (TaN), tungsten nitride (WN), or titanium aluminum nitride (TiAlN), and a nitride of a high-melting-point metal silicide, such as titanium silicide nitride (TiSiN) or tungsten silicide nitride (WSiN). Then, a third interlayer insulating film 24 of a plasma TEOS film is formed on the chalcogenide layer 20 and the upper electrode 21. A via hole (a connecting hole) 25 leading to a wiring layer, which serves as a bit line, is formed on the upper electrode 21.

Figure 2A:
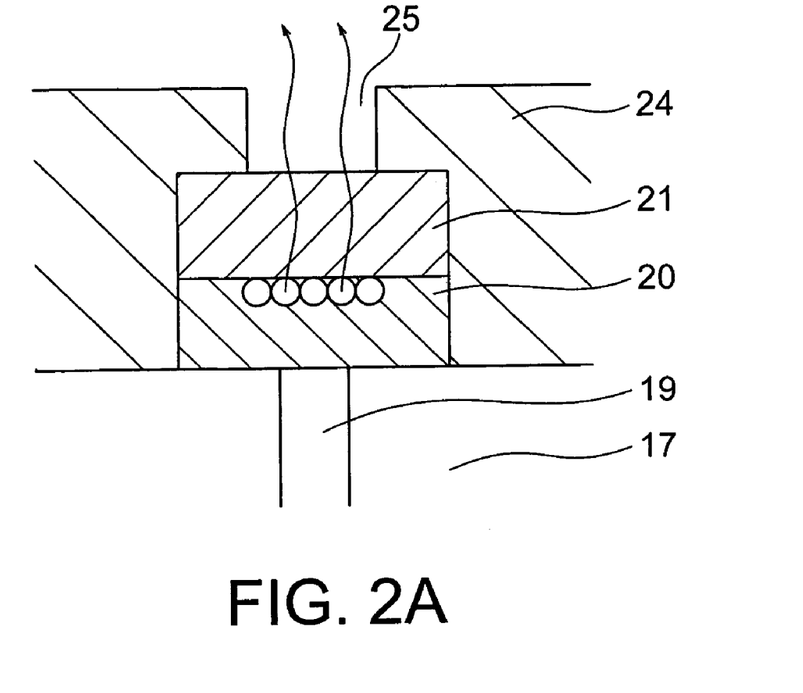
FIG. 2A is a schematic view illustrating the sublimation of a chalcogenide layer at the beginning of the formation of a metal film.
Figure 2B:
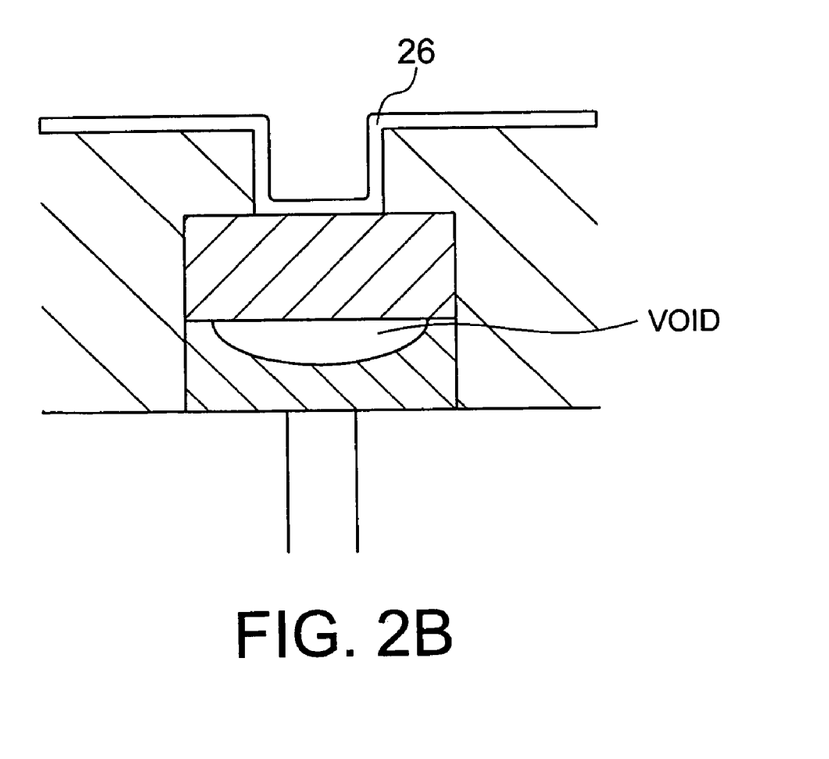
FIG. 2B is a cross-sectional view of the chalcogenide layer after the sublimation.

A titanium nitride (TiN) film and a tungsten (W) film are formed by a CVD method in the via hole 25 as a plug. As shown in FIG. 2A, part of the chalcogenide layer 20 sublimes in an early stage of the formation of this plug. Although the chalcogenide layer 20 is formed under the upper electrode 21, part of the chalcogenide layer 20 sublimes through the upper electrode 21 at the processing temperature of the formation of the plug. This generates a void in the chalcogenide layer 20 as shown in FIG. 2B. This void in the chalcogenide layer 20 decreases the mechanical strength of the portion where the via hole 25 is formed and increases the contact resistance between the chalcogenide layer 20 and the upper electrode 21. This results in lower reliability and a smaller operational margin of the phase-change memory.

A chalcogenide material has the sublimation temperature of as low as about 400° C., which is close to a lower limit of the process temperature for a typical semiconductor memory. The upper electrode 21 can be formed by sputtering at 300° C. or less. The plasma TEOS film can also be formed below the sublimation temperature. However, the plug to be connected to an upper wire is formed at a temperature as high as 550° C. to 650° C. This limits the process temperature at which a metal is buried or embedded in a hole connected with an upper wiring layer formed on a phase-change memory device using a chalcogenide material. When a metal is embedded in the connecting hole at a temperature higher than the sublimation temperature of a chalcogenide material and when the metal is not fully formed in an early stage of the process, the underlying chalcogenide layer may sublime.

When a metal is embedded in the via hole at a temperature lower than the sublimation temperature of a chalcogenide material, the metal exhibits poor step coverage on the via hole so that a void 26 may be generated inside the via hole. The void in the via hole may increase the wire resistance of the via hole and decrease the operational margin of the phase-change memory. The present inventors found that, in a process for embedding a metal in a phase-change memory, chalcogenide may sublime at higher processing temperature and a metal cannot appropriately be embedded in a via hole at lower processing temperature. In other words, the basic problem is that since a chalcogenide layer serving as a memory element in a semiconductor memory has a sublimation temperature lower than the process temperature at which a metal is embedded in a connecting hole, part of the chalcogenide layer may sublime during the embedding of the metal. The present invention has been accomplished to solve this problem using a current semiconductor manufacturing apparatus and a current manufacturing process. In the prior documents described above, the problem described herein was not recognized and naturally described no solution to the problem.

As described above, since a chalcogenide layer serving as a memory element in a semiconductor memory has a sublimation temperature lower than the process temperature at which a metal is embedded in a via hole (a connecting hole), part of the chalcogenide layer may undesirably sublime during the embedding of the metal.

Accordingly, in view of the problem described above, it is an object of the present invention to provide a memory cell structure and a semiconductor memory in which a metal can be embedded in a via hole connected with an upper wiring layer using a current semiconductor manufacturing apparatus and a current semiconductor process without the sublimation of a chalcogenide layer.

The present invention basically employs the following technology to solve the problem described above. It is a matter of course that the present application also encompasses any modified technology without departing from the gist of the technology.

A semiconductor memory according to the present invention includes a matrix of memory cells each composed of one transistor and one chalcogenide layer as a memory element. No chalcogenide layer is disposed at a joint between an upper electrode wire connected to the chalcogenide layer and another wiring layer.

In a semiconductor memory according to the present invention, the joint may connect the upper electrode wire to the other wiring layer with a plug of metal-containing material formed in an opening bored in an interlayer insulating film.

In a semiconductor memory according to the present invention, the joint may be disposed at an end of a cell array including a matrix of the memory cells or in a surrounding area thereof.

In a semiconductor memory according to the present invention, the upper electrode wire may also serve as a bit line of the memory cell.

In a semiconductor memory according to the present invention, the chalcogenide layers may be patterned in their corresponding memory cells and be isolated from one another.

In a semiconductor memory according to the present invention, the chalcogenide layers may have a continuous pattern among adjacent memory cells in a direction orthogonal to a word line of the memory cell and may be separated from one another among adjacent memory cells in a direction parallel to the word line.

A semiconductor memory according to the present invention may further include an upper electrode disposed between the chalcogenide layer and the upper electrode wire.

In a semiconductor memory according to the present invention, the upper electrode may have the same pattern as the chalcogenide layer and the entire top surface of the upper electrode may be in direct contact with the upper electrode wire.

In a semiconductor memory according to the present invention, the upper electrode wire may be connected to an upper wiring layer or a lower wiring layer through the plug.

In a semiconductor memory according to the present invention, the chalcogenide layer may contain at least two elements selected from the group consisting of germanium (Ge), antimony (Sb), tellurium (Te), selenium (Se), gallium (Ga), and indium (In).

In a semiconductor memory according to the present invention, the upper electrode wire may contain one selected from the group consisting of a high-melting-point metal and a nitride thereof, such as tungsten (W), titanium nitride (TiN), tantalum nitride (TaN), tungsten nitride (WN), or titanium aluminum nitride (TiAlN) and a nitride of a high-melting-point metal silicide, such as titanium silicide nitride (TiSiN) or tungsten silicide nitride (WSiN).

A semiconductor memory including a memory element of a phase change material according to the present invention includes a lower heater connected to one diffusion layer of a transistor, a chalcogenide layer connected to the lower heater, and an upper electrode wire covering at least the top surface of the chalcogenide layer. The upper electrode wire has a memory cell connected to another wiring layer at a place where the chalcogenide layer is not disposed.

In a semiconductor memory according to the present invention, the upper electrode wire may serve as a bit line and a gate wire of the transistor may serve as a word line.

According to the present invention, no chalcogenide layer is present under part of an upper electrode wire to be connected to another wiring layer. With such a structure, the sublimation of part of the chalcogenide layer can be prevented when a metal is embedded in a via hole connected with another wiring layer.

DESCRIPTION OF THE PREFERRED EMBODIMENTS

A semiconductor memory according to the present invention will be described with reference to the drawings.

Embodiment 1

FIGS. 3 to 7 illustrate Embodiment 1. FIGS. 3 to 6 are cross-sectional views illustrating main processes for manufacturing a semiconductor memory. FIGS. 7A and 7B are plan views of a semiconductor memory. While the present invention is described herein with a memory cell circuit illustrated in FIG. 1A, it is applicable to a memory cell circuit illustrated in FIG. 1B.

Figure 3:
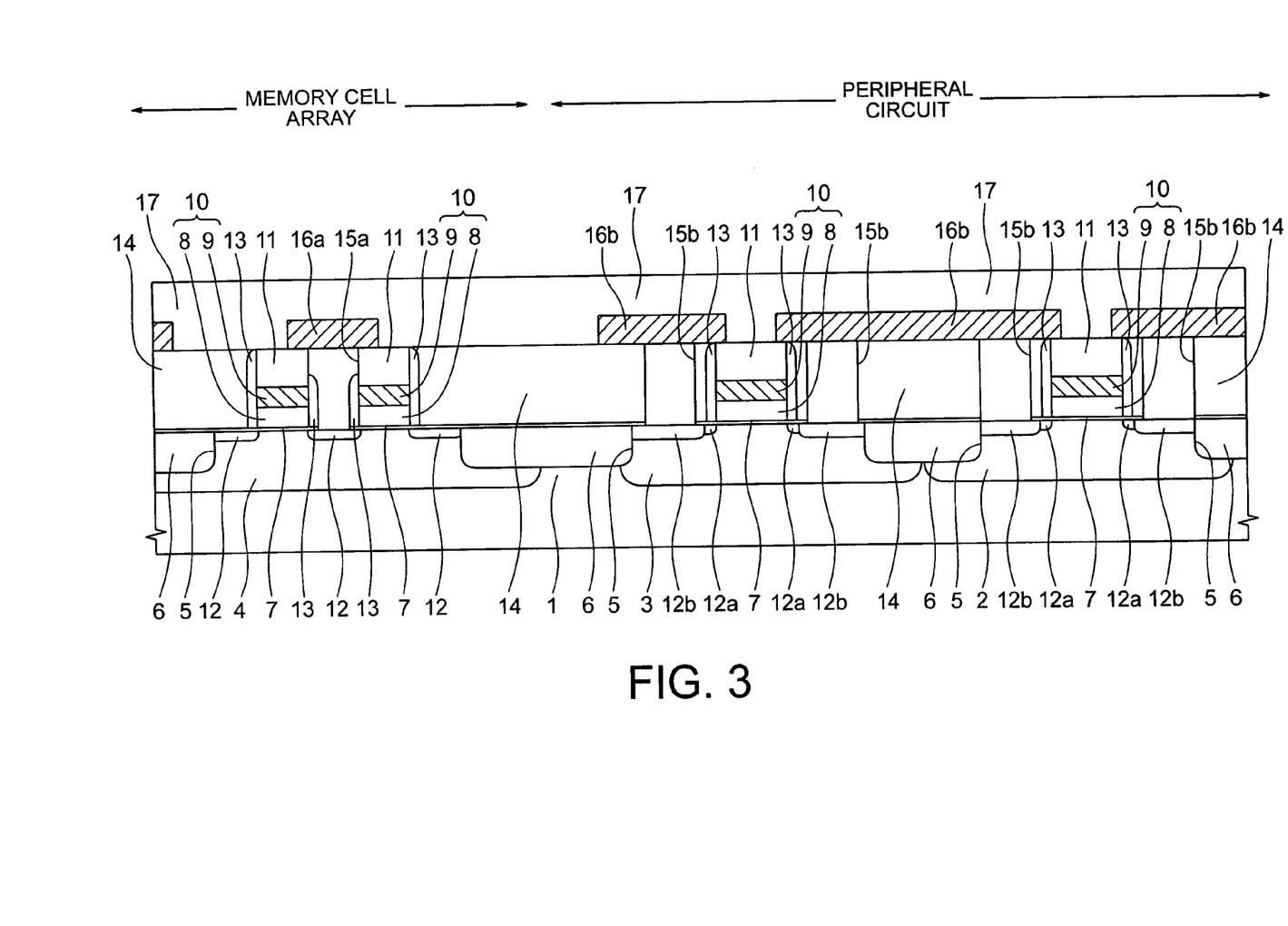
FIG. 3 is a cross-sectional view illustrating intermediate process (1) according to Embodiment 1.

As illustrated in FIG. 3, according to a CMOS process, a shallow trench 5 is opened in a semiconductor substrate 1 to form a device isolation region 6 covered with an insulating film. NMOS transistors are formed in P well regions 3 and 4. A PMOS transistor is formed in an N well region 2. Each MOS transistor comprises a gate insulating film 7, a gate electrode 10 in which a polysilicon layer 8 and a metal layer 9 are stacked, a cap insulating film 11, a side-wall silicon nitride film 13, and an impurity diffusion region 12. The impurity diffusion region 12 has a Lightly Doped Drain (LDD) structure including a low-concentration impurity diffusion region 12a and a high-concentration impurity diffusion region 12b. A first interlayer insulating film 14 is formed on the top surface of each transistor. A contact 15 is bored in the first interlayer insulating film 14. A first wiring layer 16 is formed on the first interlayer insulating film 14. Specifically, in an array portion, the contact 15 is a contact 15a of a memory cell and the first wiring layer 16 is a first wiring layer 16a of the memory cell. In a surrounding area (namely, a peripheral area), the contact 15 is a wiring contact 15b of a peripheral circuit and the first wiring layer 16 is a first wiring layer 16b of the peripheral circuit. A second interlayer insulating film 17 is formed on the first interlayer insulating film 14 to flatten the surface.

Figure 4:
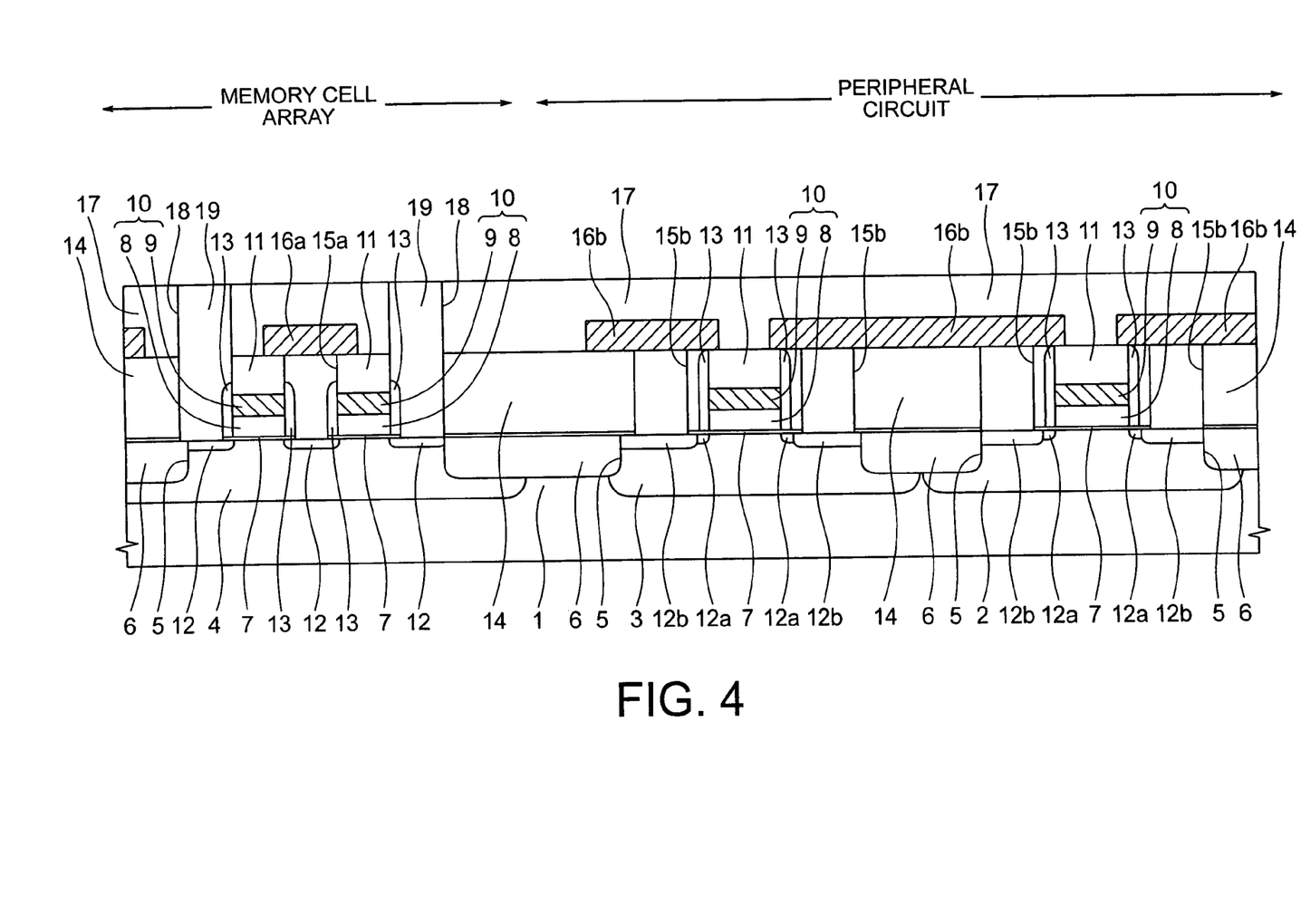
FIG. 4 is a cross-sectional view illustrating intermediate process (2) according to Embodiment 1.
Figure 5:
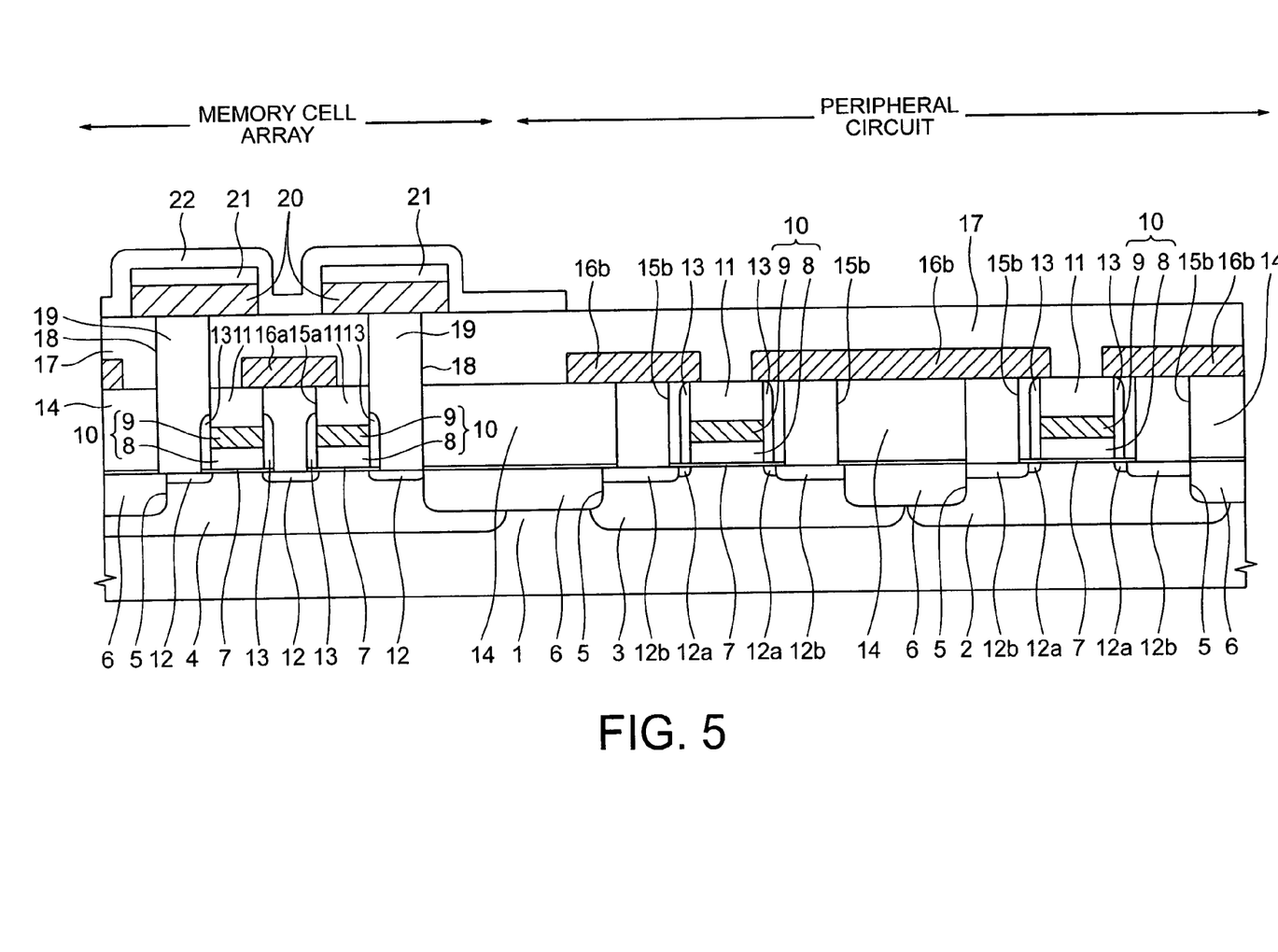
FIG. 5 is a cross-sectional view illustrating intermediate process (3) according to Embodiment 1.

Then, as illustrated in FIG. 4, a lower heater contact 18 reaching the impurity diffusion region 12 is formed in the second and first interlayer insulating films 17 and 14. The lower heater contact 18 is filled with a metal to form a lower heater contact plug 19. As illustrated in FIG. 5, a chalcogenide layer 20 and an upper electrode 21 are formed on the second interlayer insulating film 17. Then, the chalcogenide layer 20 and the upper electrode 21 in one bit are separated in the same pattern from those in another bit by lithography and dry etching. Then, a conductive material serving as an upper electrode wire 22 is deposited on the entire top surface and is processed by lithography and dry etching. The upper electrode wire 22 is patterned to cover the entire top surface of the upper electrode 21. The upper electrode wire 22 can also serve as a bit line.

Preferably, the lower heater contact plug 19, the upper electrode 21, and the upper electrode wire 22 contain one selected from the group consisting of a high-melting-point metal and nitride thereof, such as tungsten (W), titanium nitride (TiN), tantalum nitride (TaN), tungsten nitride (WN), or titanium aluminum nitride (TiAlN), and a nitride of a high-melting-point metal silicide, such as titanium silicide nitride (TiSiN) or tungsten silicide nitride (WSiN). The upper electrode 21 prevents the chalcogenide layer 20 from being deteriorated when the chalcogenide layer 20 is processed by lithography and dry etching. Thus, the upper electrode 21 may be eliminated in a manner that depends on these process conditions.

The chalcogenide layer 20 may be formed of a material containing at least two elements selected from the group consisting of germanium (Ge), antimony (Sb), tellurium (Te), selenium (Se), gallium (Ga), and indium (In). For example, the chalcogenide layer 20 is formed of gallium antimonide (GaSb), indium antimonide (InSb), indium selenide (InSe), antimony telluride ($Sb_2Te_3$), germanium telluride (GeTe), $Ge_2Sb_2Te_5$, InSbTe, GaSeTe, $SnSb_2Te_4$, or InSbGe.

Figure 6:
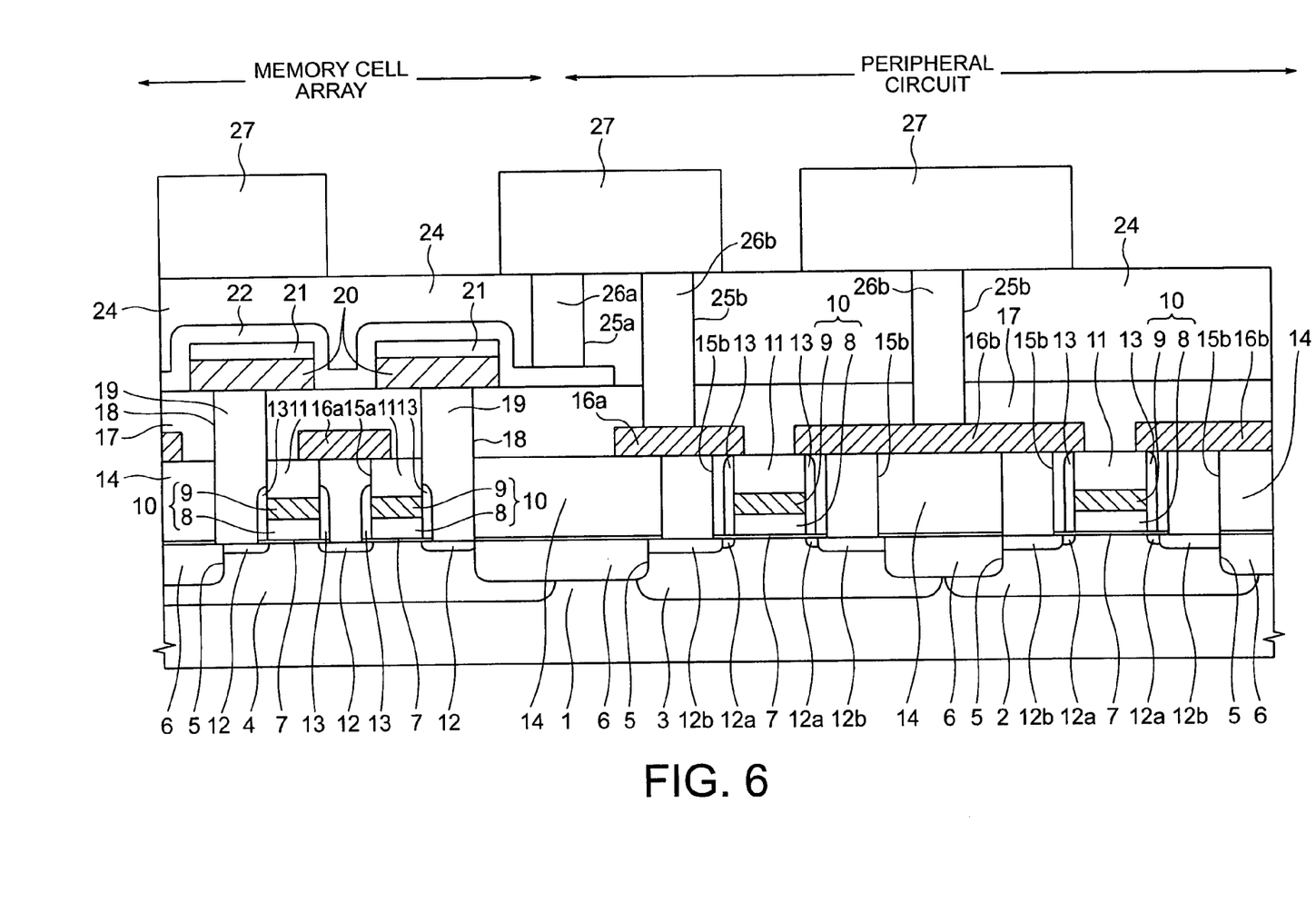
FIG. 6 is a cross-sectional view illustrating intermediate process (4) according to Embodiment 1.

Then, as illustrated in FIG. 6, a third interlayer insulating film 24 is formed on the top surface. Via holes (connecting holes) 25a and 25b are then bored in the third interlayer insulating film 24. A metallic film, for example, a film formed of a tungsten film and a titanium nitride film is formed in the via holes 25a and 25b by a CVD method. Via plugs (connecting plugs) 26a and 26b are formed by polishing and etchback, for example, by a CMP method. Then, an aluminum alloy-based film is formed, for example, by sputtering and is processed in a desired pattern by lithography and dry etching into a second wiring layer 27. The chalcogenide layer 20 is connected to a peripheral circuit through the upper electrode wire 22, the connecting plug 26a, the second wiring layer 27, and the connecting plug 26b. It is noted hear that the indexes a and b in the via holes 25a and 25b and the via plugs 26a and 26b indicate an array portion and a surrounding area, respectively.

Figure 7A:
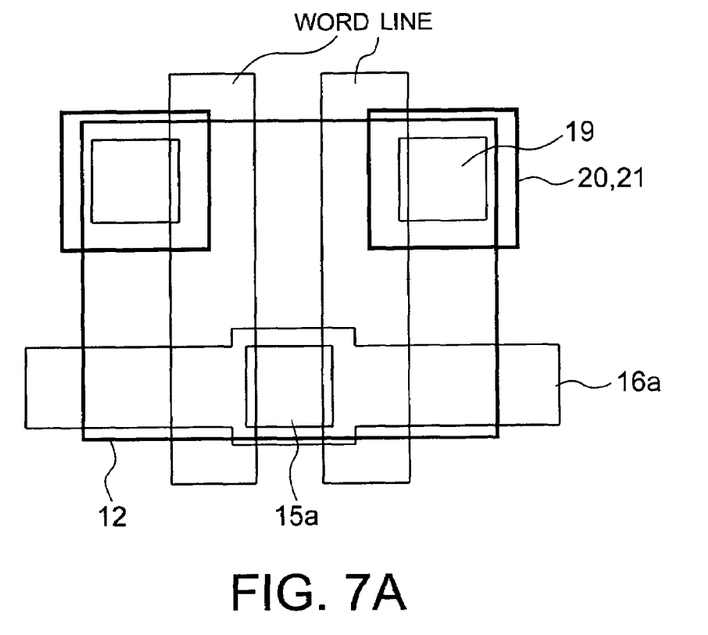
FIG. 7A is a plan view of a semiconductor memory after the patterning of a chalcogenide layer according to Embodiment 1.
Figure 7B:
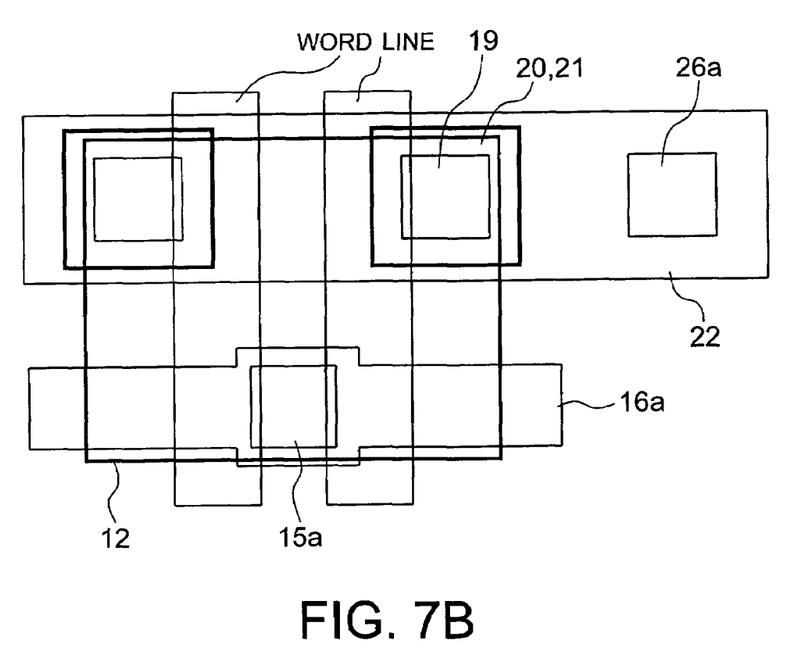
FIG. 7B is a plan view of a semiconductor memory after the wiring of an upper electrode according to Embodiment 1.

FIGS. 7A and 7B are plan views of a memory cell illustrating the position of a chalcogenide layer 20 and an upper electrode wire 22 according to the present Embodiment 1. FIG. 7A illustrates two memory cells. The chalcogenide layer 20 connected to the lower heater contact plug 19 and the upper electrode 21 in one bit are separated in the same pattern from those in another bit. A common impurity diffusion region of two access transistors is connected to a constant potential wire 16a through a memory cell contact 15a. Gate electrodes of the two access transistors are wired as word lines in the vertical direction.

As illustrated in FIG. 7B, the upper electrode wire 22 is wired orthogonally to the word line to cover the entire top surface of the chalcogenide layer 20 and the upper electrode 21. The upper electrode wire 22 constitutes a bit line of the memory cell. Each intersection point of the bit line and the word line acts as a memory cell. The upper electrode wire 22 is connected to the second wiring layer 27 (not shown) through a via plug (a connecting plug) 26a. The via plug 26a is disposed at an end of a cell array of memory cells. No chalcogenide layer is present at a via hole portion of the via plug 26a. Separation of the via hole from the chalcogenide layer allows doubled or redoubled protection of the chalcogenide layer with the upper electrode, the upper electrode wire, and the interlayer insulating film. Thus, even when the processing temperature at which a metal is embedded in a via plug is higher than the sublimation temperature of the chalcogenide layer, the chalcogenide layer does not sublime.

The memory cell according to the present embodiment uses the upper electrode wire as a lead of the chalcogenide layer to connect the chalcogenide layer with another wiring layer in a region where the chalcogenide layer is not present. A hole to be connected with another wiring layer is formed in a region where the chalcogenide layer is not present. Thus, when a metal is embedded in the connecting hole, the processing temperature can be higher than the sublimation temperature of the chalcogenide layer. Such a structure can provide a memory cell structure having an excellent connectivity without the sublimation of the chalcogenide layer and a semiconductor memory including the memory cell.

Embodiment 2

Figure 8:
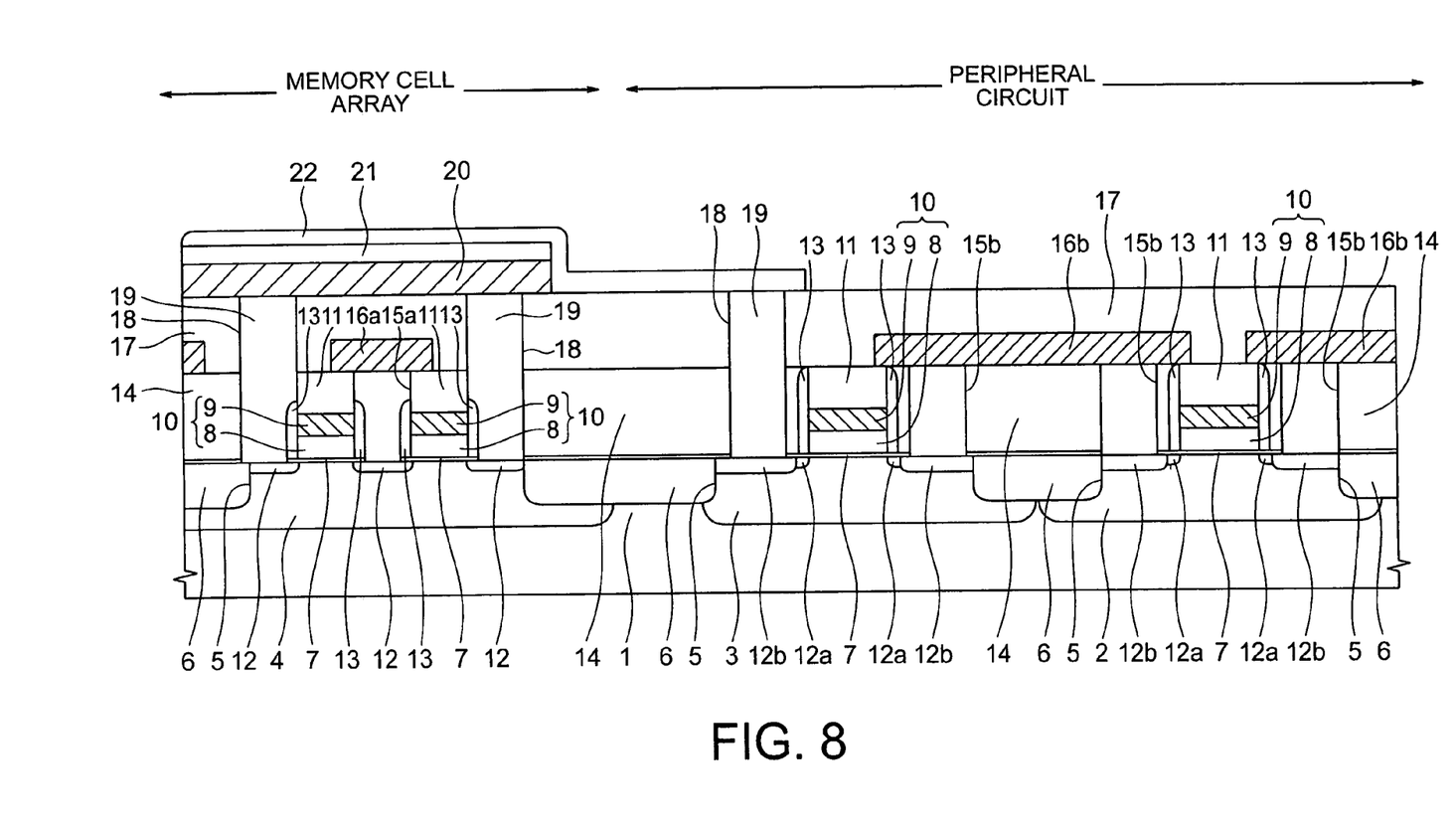
FIG. 8 is a cross-sectional view of a semiconductor memory according to Embodiment 2.
Figure 9A:
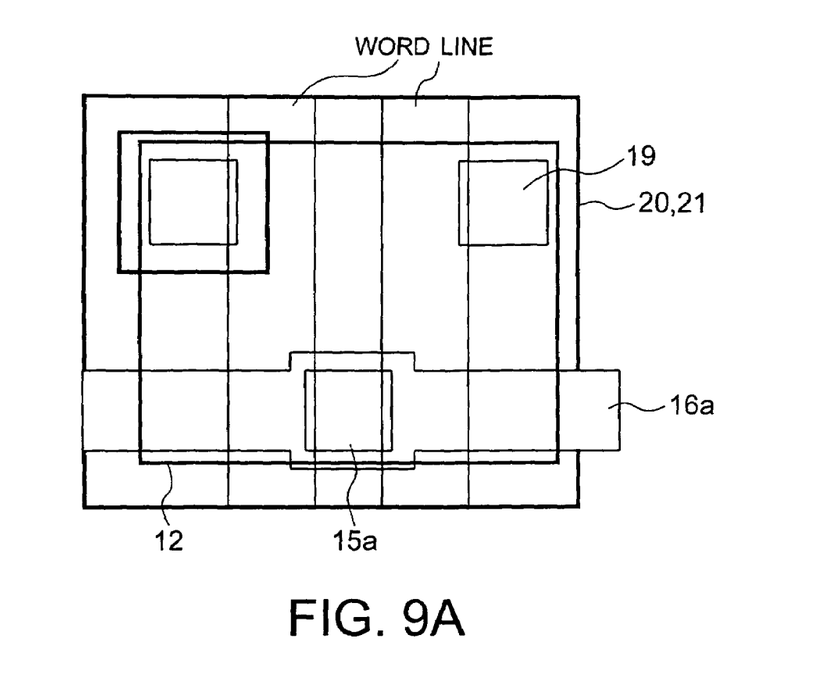
FIG. 9A is a plan view of a semiconductor memory after the patterning of a chalcogenide layer according to Embodiment 2.
Figure 9B:
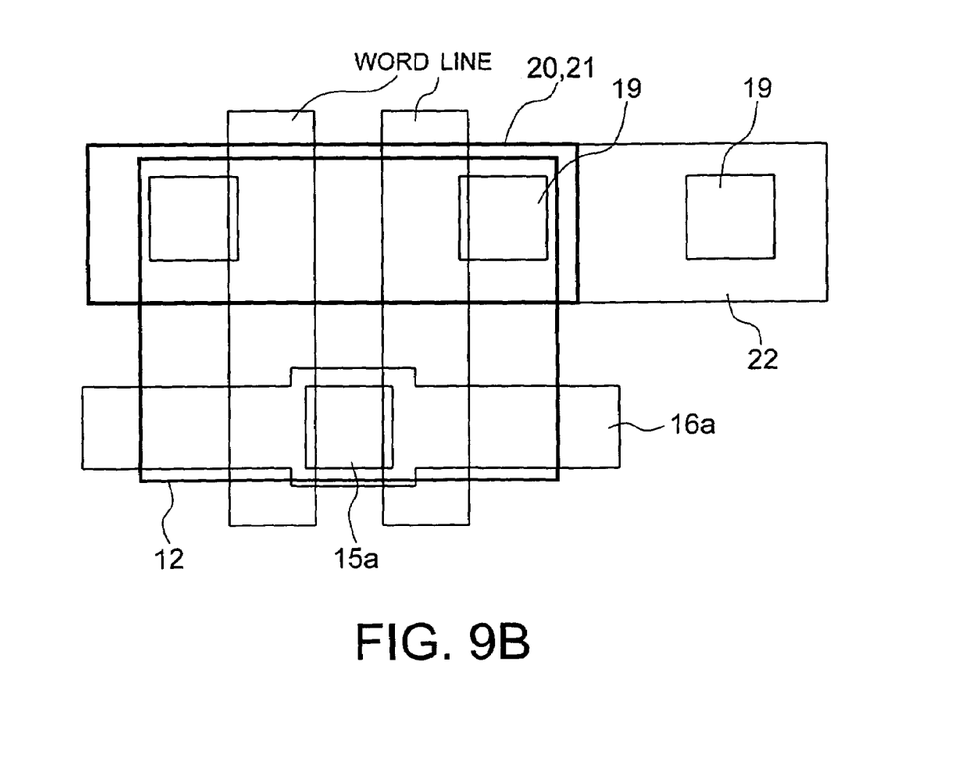
FIG. 9B is a plan view of a semiconductor memory after the wiring of an upper electrode according to Embodiment 2.

FIGS. 8 and 9 illustrate Embodiment 2 according to the present invention. FIG. 8 is a cross-sectional view and FIGS. 9A and 9B are plan views of a semiconductor memory. In a memory cell according to the present embodiment, a via hole is formed in a region where a chalcogenide layer is not present and an upper electrode wire is connected to an impurity diffusion region serving as a lower wiring layer. Notice that similar reference numerals and letters refer to similar items in Embodiment 1, and it may not be discussed in the present embodiment.

In FIG. 8, a lower heater contact plug 19 of a memory cell array is connected to a chalcogenide layer 20 and an upper electrode 21. An upper electrode wire 22 is disposed on the upper electrode 21. The upper electrode wire 22 extends from the memory cell array to a peripheral circuit and is connected to an impurity diffusion region 12b through the lower heater contact plug 19 of the peripheral circuit. The connection to the impurity diffusion region 12b occurs in the peripheral circuit region. The lower heater contact plug 19 is formed in one impurity diffusion region of a transistor in the peripheral circuit and is connected to the extending upper electrode wire 22. In this case, the chalcogenide layer 20 is also not present at a joint between the upper electrode wire 22 and another wiring layer (impurity diffusion region in this embodiment). The upper electrode wire 22 is connected to the impurity diffusion region 12b and is not connected to an upper wiring layer. Thus, when a via plug is formed to connect to an upper wiring layer, since the chalcogenide layer 20 is under doubled or redoubled protection with the upper electrode 21, the upper electrode wire 22, and an interlayer insulating film, the chalcogenide layer does not sublime.

In the present embodiment, the chalcogenide layer 20 and the upper electrode 21 in one memory cell are not separated from those in another memory cell and have a continuous pattern. The present embodiment is further described with reference to plan views of FIGS. 9A and 9B. In FIG. 9A, the chalcogenide layer 20 and the upper electrode 21 are patterned on a cell array region mat. In the cell array region mat, memory cells are arranged, for example, in a matrix. One side of the periphery is a sense amplifier region connected to a bit line, and the other side is a cell array region surrounded by an address decoder region. Accordingly, the chalcogenide layer 20 and the upper electrode 21 are patterned only at an end of the cell array and have a continuous pattern in the cell array.

As illustrated in FIG. 9B, the upper electrode wire 22 has a continuous pattern among adjacent memory cells in a direction orthogonal to a word line of the memory cell and is divided among adjacent memory cells in a direction parallel to the word line. The upper electrode wire 22 is extended to a peripheral circuit and is connected to a lower heater contact plug 19 in a surrounding area (a peripheral area). Although the lower heater contact plug 19 in the surrounding area does not function as a heater, since it is formed simultaneously with the lower heater contact plug 19 in the memory cell, they are both referred to as lower heater contact plug 19. The chalcogenide layer 20 and the upper electrode 21 exposed in the cell array are also etched and are divided into two in the vertical direction on the drawing. Each intersection point of the word line and the upper electrode wire 22 acts as a memory cell. Therefore, the upper electrode wire 22 may also serve as a bit line. In this embodiment, since no chalcogenide layer is present at a via hole portion to be connected with the upper electrode wire 22, the chalcogenide layer does not sublime during the formation of a plug.

The memory cell according to the present embodiment uses the upper electrode wire as a lead of the chalcogenide layer. The upper electrode wire is connected to a lower wiring layer through a plug in the peripheral circuit region. Thus, when a plug to be connected to an upper wiring layer is formed, it is not connected to an upper electrode wire. Consequently, the chalcogenide layer dose not sublime at a processing temperature higher than the sublimation temperature of the chalcogenide layer. Such a structure can provide a memory cell having an excellent connectivity without the sublimation of the chalcogenide layer and a semiconductor memory including the memory cell.

In Embodiment 1, a chalcogenide layer in one memory cell is separated from that in another memory cell, and an upper electrode wire is connected to an upper wiring layer in a region where no chalcogenide layer is present. In Embodiment 2, a chalcogenide layer has a continuous pattern in a direction of a bit line, and an upper electrode wire is connected to a lower wiring layer in a region where no chalcogenide layer is present. The present invention is not limited to these combinations and encompasses any other combination. The present invention is not limited to the disclosed embodiments. Various modifications may be made without departing from the spirit and scope of the present invention. The present application also encompasses these modifications.

What is claimed is:

1. A semiconductor memory having a memory element, the memory element comprising:
    an insulating film having an upper surface;
    a first electrode selectively formed in the insulating film and having an upper surface that is substantially coplanar with the upper surface of the insulating film;
    a phase-change layer disposed on the first electrode and having an upper surface, a terminating edge, and a side surface crossing the upper surface at the terminating edge, the terminating edge and the side surface defining a periphery of the phase-change layer, the side surface of the phase-change layer further crossing the upper surface of the insulating film;
    a second electrode disposed on the phase-change layer, the second electrode having an elongated portion which extends beyond the terminating edge of the phase-change layer over the insulating film in contact with the side surface of the phase-change layer and with the upper surface of the insulating film;
    a wiring layer; and
    a first contact plug disposed on the elongated portion of the second electrode to form an electrical path between the second electrode and the wiring layer.

2. The semiconductor memory as claimed in claim 1, wherein the phase-change layer has an extending portion disposed on the insulating film between the first electrode and the elongated portion of the second electrode.

3. The semiconductor memory as claimed in claim 1, wherein the memory element further comprises a first transistor having a diffusion region selectively disposed in a semiconductor substrate, and the first electrode penetrates the insulating film to reach the diffusion region of the first transistor.

4. The semiconductor memory as claimed in claim 1, wherein the second electrode has a first conductive layer and a second conductive layer, wherein the second conductive layer is sandwiched between the first conductive layer and the phase-change layer, and the first conductive layer includes the elongated portion of the second electrode.

5. The semiconductor memory as claimed in claim 4, wherein the first conductive layer functions as a bit line.

6. The semiconductor memory as claimed in claim 1, further comprising;
    a peripheral circuit including a second transistor; and
    a second contact plug to form an electrical path between the wiring layer and a diffusion layer of the second transistor, wherein the diffusion layer is selectively disposed in the semiconductor substrate.

7. A semiconductor memory having a memory element, the memory element
comprising:
an insulating film having an upper surface;
a first electrode selectively formed in the insulating film and having an upper surface;
a contact plug selectively formed in the insulating film apart from the first electrode and having an upper surface, the upper surface of the contact plug being substantially coplanar with the upper surfaces of the insulating film and the first electrode;
a phase-change layer disposed on the first electrode and having a terminating edge defining a periphery of the phase-change layer;
a second electrode disposed on the phase-change layer, the second electrode having an elongated portion which extends beyond the terminating edge of the phase-change layer over the insulating film in contact with the contact plug; and
a peripheral circuit including a transistor, the transistor having an electrical contact with the contact plug to form an electrical path between the second electrode and the transistor through the elongated portion of the second electrode.

8. The semiconductor memory as claimed in claim 7, wherein the second electrode has a first conductive layer and a second conductive layer,
wherein the second conductive layer is sandwiched between the first conductive layer and the phase-change layer, and the first conductive layer includes the elongated portion of the second electrode.

9. The semiconductor memory as claimed in claim 8, wherein the first conductive layer functions as a bit line.

10. A semiconductor memory having a memory element, the memory element comprising:
a first transistor;
a first electrode electrically connected to the first transistor;
a phase-change layer disposed on the first electrode and a terminating edge defining a periphery of the phase-change layer;
a second electrode disposed on the phase-change layer, the second electrode having an elongated portion which extends beyond the terminating edge of the phase-change layer;
a second transistor;
an insulating layer covering the elongated portion of the second electrode and the second transistor;
a wiring layer formed over the insulating layer;
a first contact plug selectively formed in the insulating film in contact with the elongated portion of the second electrode and with a part of the wiring layer; and
a second contact plug selectively formed in the insulating film in contact with another part of the wiring layer, the second contact plug being electrically connected to the second transistor to form an electrical path between the second electrode and the second transistor through the wiring layer and the first and second contact plugs.

11. The semiconductor memory as claimed in claim 10, wherein the phase-change layer has an upper surface and a side surface crossing the upper surface at the terminating edge, the terminating edge and the side surface defining the periphery of the phase-change layer, and
the memory element further comprises an insulating film surrounding the first electrode, the insulating film having an upper surface that is substantially coplanar with an upper surface of the first electrode so that the side surface of the phase-change layer further crossing the upper surface of the insulating film, the elongated portion of the second electrode being extended over the insulating film in contact with a substantial whole of the side surface of the phase-change layer and with the upper surface of the insulating film.

* * * * *